(12) United States Patent
Chou et al.

(10) Patent No.: US 11,043,583 B2
(45) Date of Patent: Jun. 22, 2021

(54) SEMICONDUCTOR STRUCTURE AND METHOD FOR FORMING THE SAME

(71) Applicant: Vanguard International Semiconductor Corporation, Hsinchu (TW)

(72) Inventors: Yu-Chieh Chou, New Taipei (TW); Hsin-Chih Lin, Hsinchu (TW); Chang-Xiang Hung, Chiayi County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/417,142

(22) Filed: May 20, 2019

(65) Prior Publication Data

US 2020/0373420 A1 Nov. 26, 2020

(51) Int. Cl.
| | |
|---|---|
| *H01L 29/205* | (2006.01) |
| *H01L 29/778* | (2006.01) |
| *H01L 29/20* | (2006.01) |
| *H01L 29/66* | (2006.01) |
| *H01L 29/40* | (2006.01) |

(52) U.S. Cl.
CPC ...... *H01L 29/7786* (2013.01); *H01L 29/2003* (2013.01); *H01L 29/205* (2013.01); *H01L 29/404* (2013.01); *H01L 29/66462* (2013.01)

(58) Field of Classification Search
CPC ............. H01L 29/7786; H01L 29/2003; H01L 29/205
See application file for complete search history.

(56) References Cited

U.S. PATENT DOCUMENTS

| | | | | |
|---|---|---|---|---|
| 5,252,843 | A | * 10/1993 | Suzuki | ............. H01L 21/28587 257/280 |
| 2012/0228704 | A1 | 9/2012 | Ju | |
| 2015/0132932 | A1 | * 5/2015 | Green | ............. H01L 21/28581 438/570 |
| 2016/0079066 | A1 | 3/2016 | Takada et al. | |
| 2016/0079426 | A1 | 3/2016 | Kume et al. | |
| 2016/0190297 | A1 | 6/2016 | Kudymov et al. | |
| 2016/0268408 | A1 | 9/2016 | Oasa et al. | |

OTHER PUBLICATIONS

Taiwanese Office Action and Search Report for Taiwanese Application No. 108112255, dated Oct. 25, 2019.

* cited by examiner

*Primary Examiner* — Trang Q Tran
(74) *Attorney, Agent, or Firm* — Birch, Stewart, Kolasch & Birch, LLP (57) ABSTRACT

A semiconductor structure includes a substrate, a gate electrode, a first dielectric layer, a gate metal layer, a source structure, and a drain structure. The first dielectric layer has a first opening exposing the gate electrode and a second opening, and the depth of the second opening is greater than the depth of the first opening. The gate metal layer conformally covers the top surface of the first dielectric layer, the first opening, and the second opening to serve as a gate field plate. A first portion of the gate metal layer at the bottom of the first opening is higher than a second portion of the gate metal layer at the bottom of the second opening. The source structure and the drain structure are disposed at opposite sides of the gate structure, wherein the second opening is disposed between the gate electrode and the drain structure.

20 Claims, 8 Drawing Sheets

SEMICONDUCTOR STRUCTURE AND METHOD FOR FORMING THE SAME

BACKGROUND

Technical Field

The disclosure relates to a semiconductor structure, and more particularly to semiconductor structure having field plates and methods for forming the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

In high electron mobility transistors (HEMT), field plates are typically disposed in the high electric field region of the semiconductor device in order to reduce the peak electric field of the high electric field region. A type of field plate is a field plate that is in connection with the source electrode (i.e., source field plate). The source field plate can reduce gate-to-drain capacitance ($C_{gd}$). Another type of the field plate is a field plate that is in connection with the gate electrode (i.e., gate field plate), which can reduce the electric field intensity at a side the gate near the drain. However, a further improvement of the performance and production cost of field plate structures is needed.

With the developments of GaN-based semiconductor materials, those semiconductor devices which use GaN-based semiconductor materials are applied in the more critical working environments, such as those with higher frequencies or higher temperatures. Therefore, the conditions of the process of fabricating semiconductor devices with GaN-based semiconductor materials face various new challenges.

SUMMARY

In one embodiment of the present disclosure, a semiconductor structure is provided, wherein the semiconductor structure includes a substrate, a gate electrode disposed on the substrate, a first dielectric layer disposed on the substrate, a gate metal layer, a source structure, and a drain structure. The first dielectric layer has a first opening exposing the gate electrode and a second opening adjacent to the first opening, and the depth of the second opening is greater than the depth of the first opening. The gate metal layer conformally covers the top surface of the first dielectric layer, the first opening, and the second opening to serve as a gate field plate, wherein a first portion of the gate metal layer at the bottom of the first opening is higher than a second portion of the gate metal layer at the bottom of the second opening, wherein the gate electrode and the gate metal layer form a gate structure. The source structure and the drain structure disposed on the substrate and at opposite sides of the gate structure, wherein the second opening is disposed between the gate electrode and the drain structure.

In one embodiment of the present disclosure, a method for forming a semiconductor structure is provided, wherein the method for forming a semiconductor structure includes: providing a substrate; forming a gate electrode on the substrate; forming a first dielectric layer on the substrate and covering the gate electrode; performing a first etching step to form a first opening and a second opening which is adjacent to the first opening in the first dielectric layer, wherein the first opening exposes the gate electrode; performing a second etching step to deepen the second opening, wherein the gate electrode exposed from the first opening serves as an etch stop layer; conformally forming a gate metal layer to cover the top surface of the first dielectric layer, the first opening, and the second opening to serve as a gate field plate, wherein a first portion of the gate metal layer at the bottom of the first opening is higher than a second portion of the gate metal layer at the bottom of the second opening, wherein the gate electrode and the gate metal layer form a gate structure; and forming a source structure and a drain structure on the substrate and at opposite sides of the gate structure, wherein the second opening is disposed between the gate electrode and the drain structure.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

It is understandable that additional operations may be performed before, during or after the method described, and that in other embodiments of the method, some of the operations may be substituted or omitted.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

The present disclosure provides embodiments of a semiconductor structure which includes a gate field plate near the surface of the substrate and lower than the top surface of the gate electrode to reduce the risk of high electric fields on gate electrode. The distance between the gate field plate and the substrate is mainly adjusted by an etching step in the method for forming the semiconductor structure. Therefore, the leakage current in the semiconductor structure can be reduced and the breakdown voltage can be enhanced by the gate field plate thus formed without adding additional production cost to allow the semiconductor structure to be applied to high voltage operation.

Figure 1:
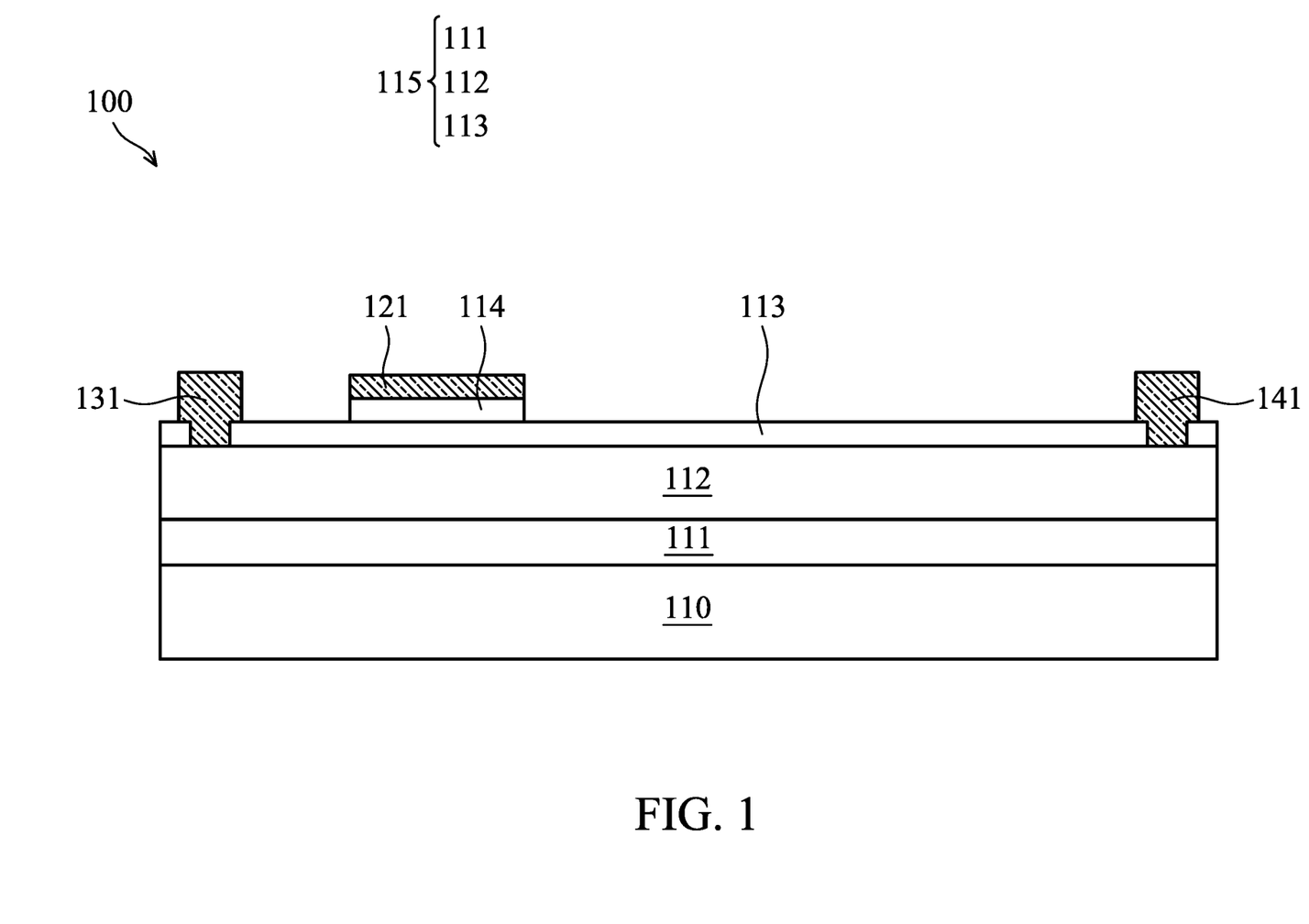
FIGS. 1-3 are cross-sectional views illustrating various steps in the process of forming a semiconductor structure according to some embodiments of the present disclosure.
Figure 4A:
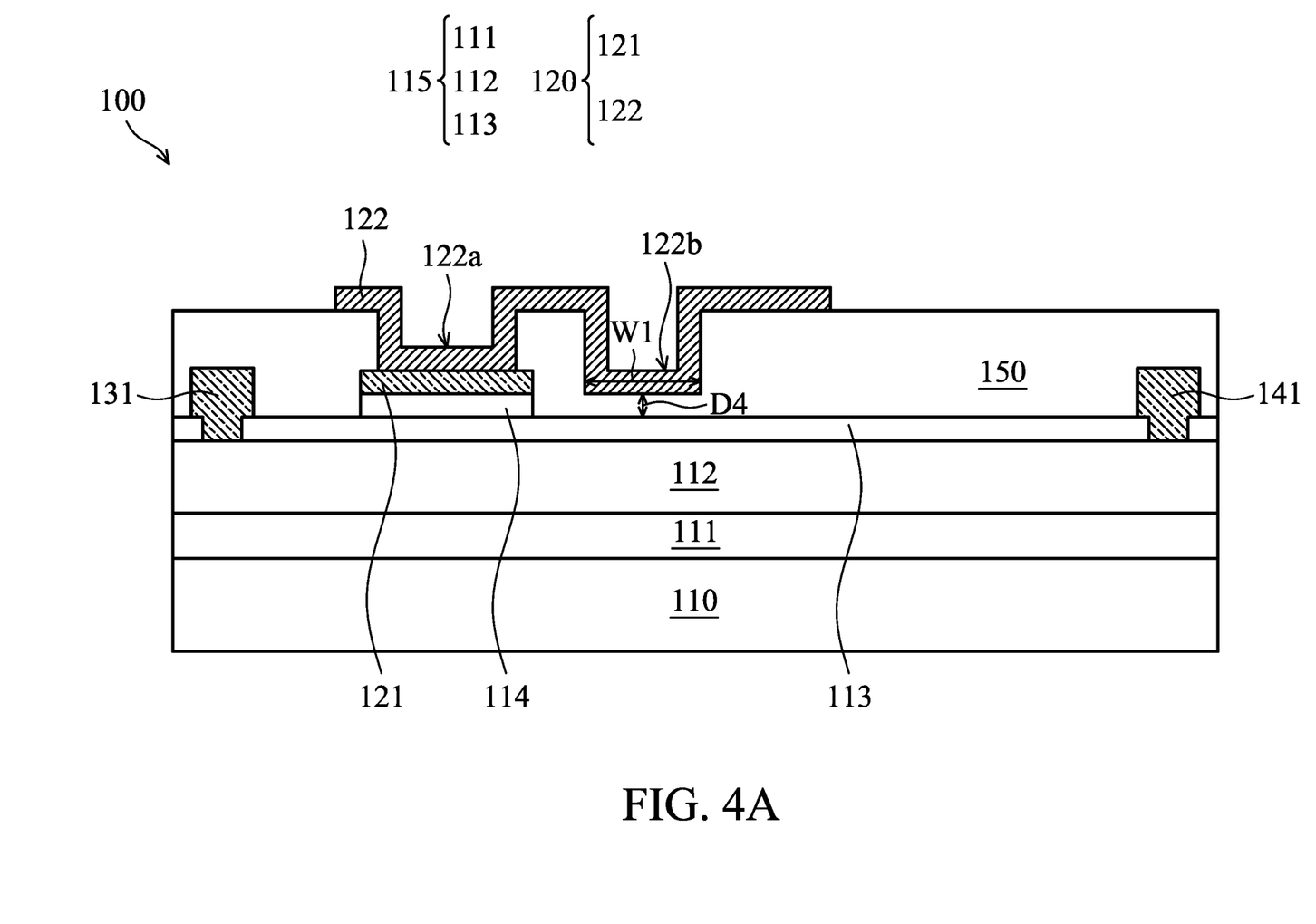
FIG. 4A is a cross-sectional diagram illustrating a semiconductor structure having a continuous gate metal layer according to some embodiments of the present disclosure.
Figure 4B:
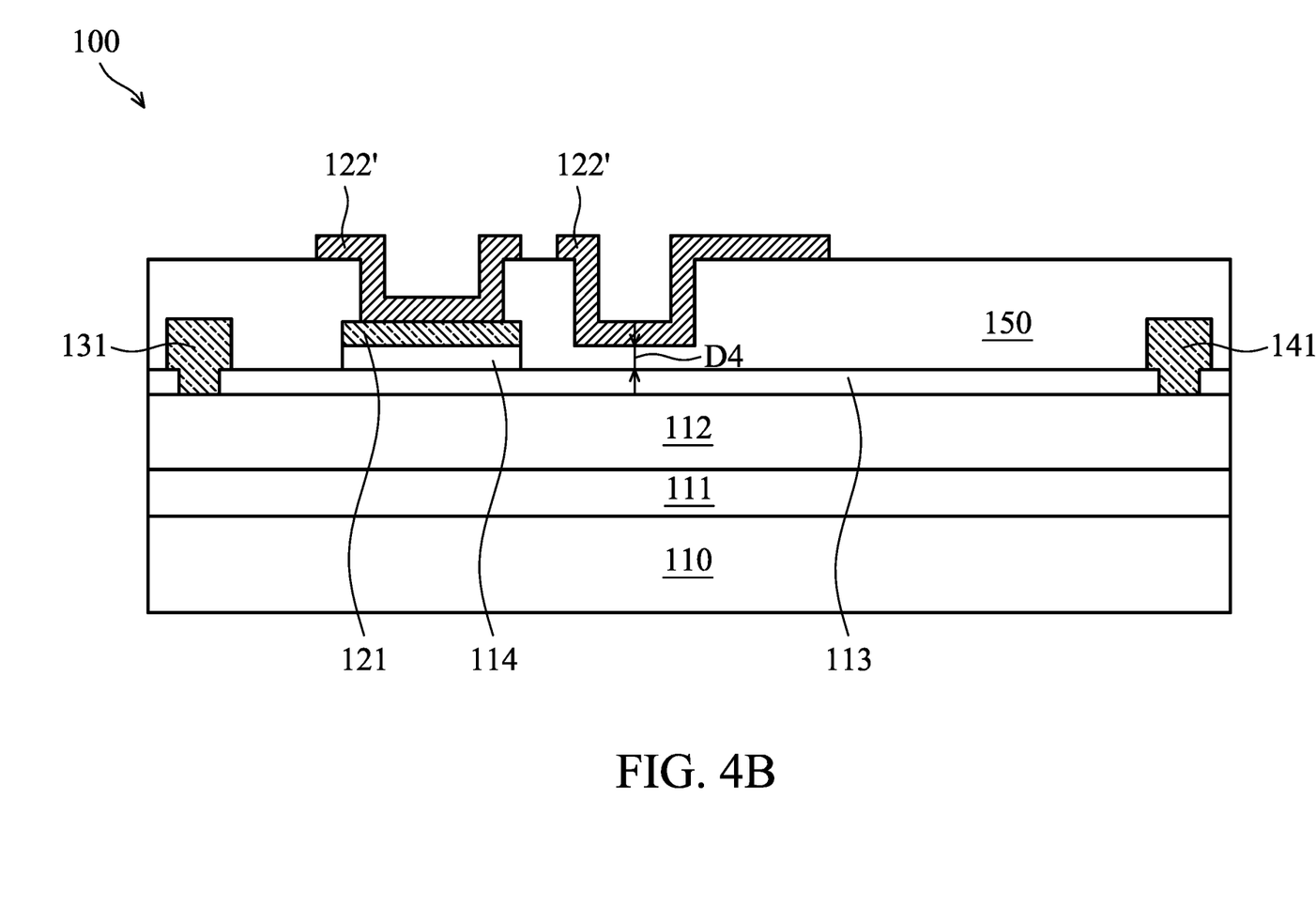
FIG. 4B is a cross-sectional diagram illustrating a semiconductor structure having a discrete gate metal layer according to other embodiments of the present disclosure.
Figure 5:
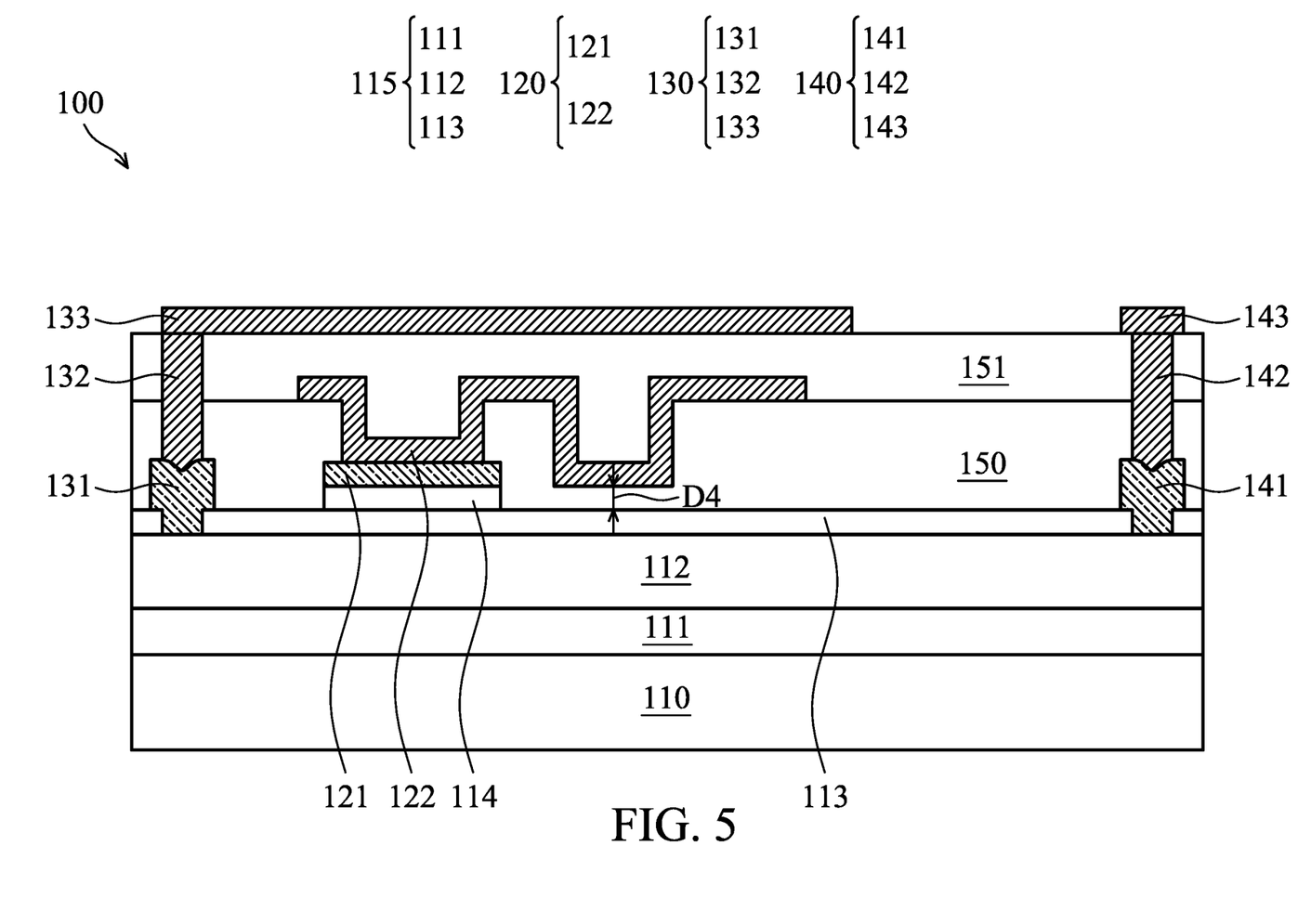
FIG. 5 is a cross-sectional diagram illustrating a semiconductor structure having a source structure and a drain structure according to some embodiments of the present disclosure.
Figure 6:
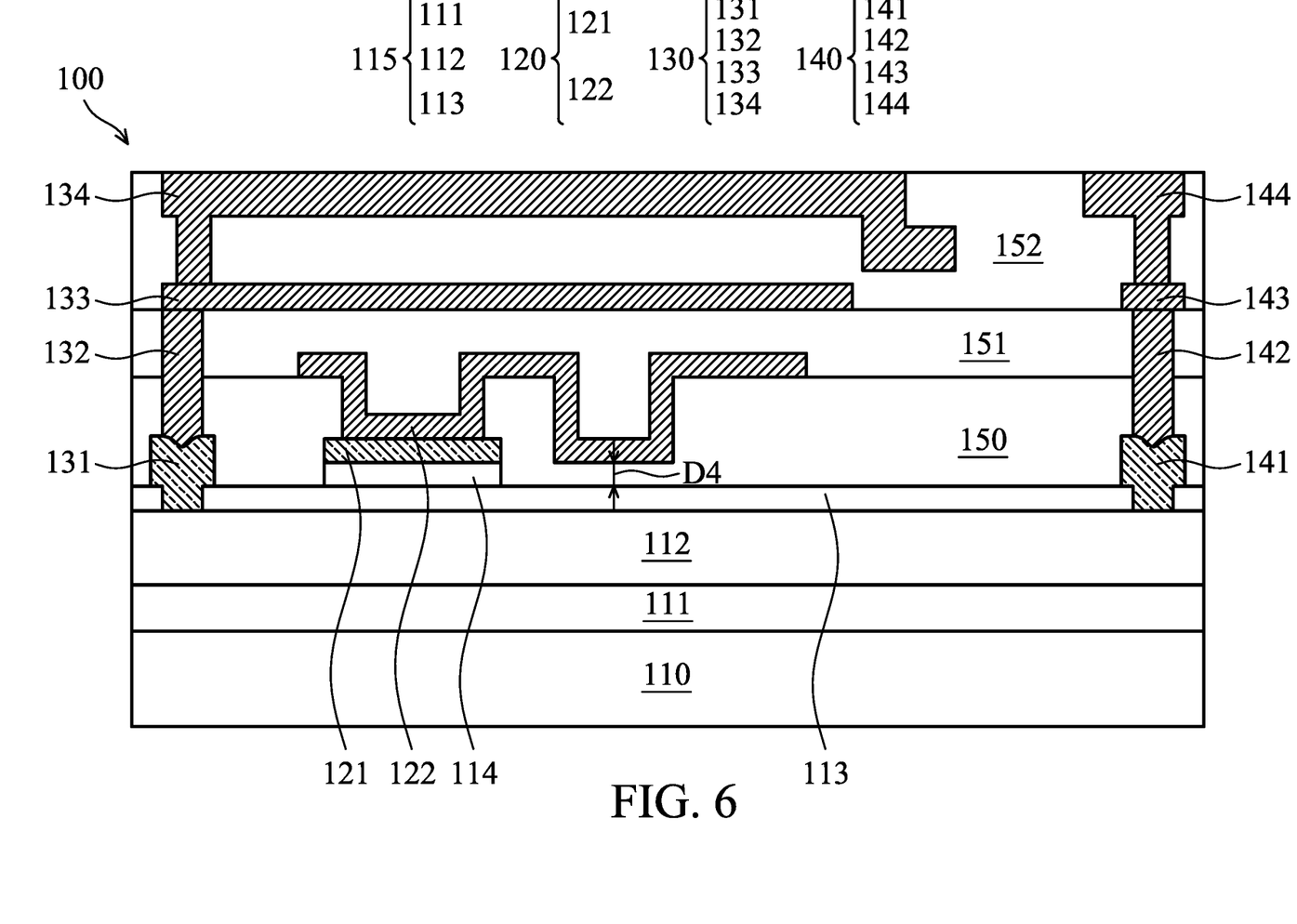
FIG. 6 is a cross-sectional diagram illustrating an exemplary semiconductor structure according to some embodiments of the present disclosure.

FIGS. 1-6 are cross-sectional views illustrating various steps in the process of forming a semiconductor structure 100 which is illustrated in FIG. 6 according to some embodiments of the present disclosure. Referring to FIG. 1, a substrate 110 is provided, a compound semiconductor layer 115 is formed on the substrate 110, and a gate electrode 121, a source electrode 131, and a drain electrode 141 are formed on the compound semiconductor layer 115. According to some embodiments of the present disclosure, the compound semiconductor layer 115 may include a seed layer (not shown), a buffer layer 111 disposed on the seed layer, a channel layer 112 disposed on the buffer layer 111, and a barrier layer 113 disposed on the channel layer 112.

In some embodiments, the substrate 110 may be a doped (such as doped with a p-type or an n-type dopant) or an undoped semiconductor substrate, such as a silicon substrate, a silicon germanium substrate, a gallium arsenide substrate, or the like. In other embodiments, the substrate 110 may be a ceramic substrate, such as an aluminium nitride (AlN) substrate, a silicon carbide (SiC) substrate, an aluminium oxide ($Al_2O_3$) (or so-called sapphire substrate), or the like.

The buffer layer 111 may be helpful to mitigate a strain of the channel layer 112 which is subsequently formed over the buffer layer 111, and to prevent defects formed in the overlying channel layer 112. The strain is caused by a mismatch between the channel layer 112 and the substrate 110. In some embodiments, the material of the buffer layer 111 may be AlN, GaN, $Al_xGa_{1-x}N$ (wherein 0<x<1), a combination thereof, or the like. The buffer layer 111 may be formed by an epitaxial growth process, such as metal organic chemical vapor deposition (MOCVD), hydride vapor phase epitaxy (HVPE), molecular beam epitaxy (MBE), a combination thereof, or the like. It should be noted that although in the embodiment as shown in FIG. 1 the buffer layer 111 is a single layer structure, the buffer layer 111 may also be a multilayered structure (not shown).

According to some embodiments of the present disclosure, two-dimensional electron gas (2DEG) (not shown) is formed at a heterogeneous interface between the channel layer 112 and the buffer layer 111. The semiconductor structure 100 as shown in FIG. 1 is a high electron mobility transistor (HEMT) which utilizes 2DEG as conductive carriers. In some embodiments, the channel layer 112 may be a GaN layer, and the barrier layer 113 formed on the channel layer 112 may be an AlGaN layer, wherein the GaN layer and the AlGaN layer may be doped, such as with an n-type or a p-type dopant, or may have no dopant therein. The channel layer 112 and the barrier layer 113 may be formed by an epitaxial growth processes, such as MOCVD, HVPE, MBE, a combination thereof, or the like.

Still referring to FIG. 1, subsequently, the gate electrode 121 is formed on the compound semiconductor layer 115 (e.g. the barrier layer 113), and the source electrode 131 and the drain electrode 141 are formed at opposite sides of the gate electrode 121. In other embodiments, an optional doped compound semiconductor layer 114 may be disposed between the gate electrode 121 and the barrier layer 113. The details will be further described later.

In some embodiments, the material of the gate electrode 121 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 113 by chemical vapor deposition (CVD), sputtering, resistive thermal evaporation process, electron beam evaporation process, or other suitable deposition processes, and a patterning process is performed on the conductive material to form the gate electrode.

According to some embodiments of the present disclosure, before the formation of the gate electrode 121, the doped compound semiconductor layer 114 may be formed on the barrier layer 113, and the gate electrode 121 is formed on the doped compound semiconductor layer 114 subsequently. The generation of 2DEG under the gate electrode 121 can be inhibited by the doped compound semiconductor layer 114 disposed between the gate electrode 121 and the barrier layer 113 so as to attain a normally-off status of the semiconductor structure 100. In some embodiments, the material of the doped compound semiconductor layer 114 may be GaN which is doped with a p-type dopant or an n-type dopant. The steps of forming the doped compound semiconductor layer 114 may include depositing a doped compound semiconductor layer (not shown) on the barrier layer 113 by using an epitaxial growth process, and performing a patterning process on the doped compound semiconductor layer to form the doped compound semiconductor layer 114 corresponding to the predetermined position where the gate electrode 121 is to be formed.

The materials of the source electrode 131 and the drain electrode 141 which are formed at opposite sides of the gate electrode 121 may be selected from the materials for forming the gate electrode 121. Furthermore, the gate electrode 121 and the source electrode 131 and the drain electrode 141 formed at opposite sides of which may be formed simultaneously in the same process. The details are not described again herein to avoid repetition. In other embodiments, the gate electrode 121 and the source electrode 131 and the drain electrode 141 formed at opposite sides of which may be formed in different processes. According to some embodiments of the present disclosure, the formed source electrode 131 and drain electrode 141 both penetrate the barrier layer 113 and contact the channel layer 112.

Figure 2:
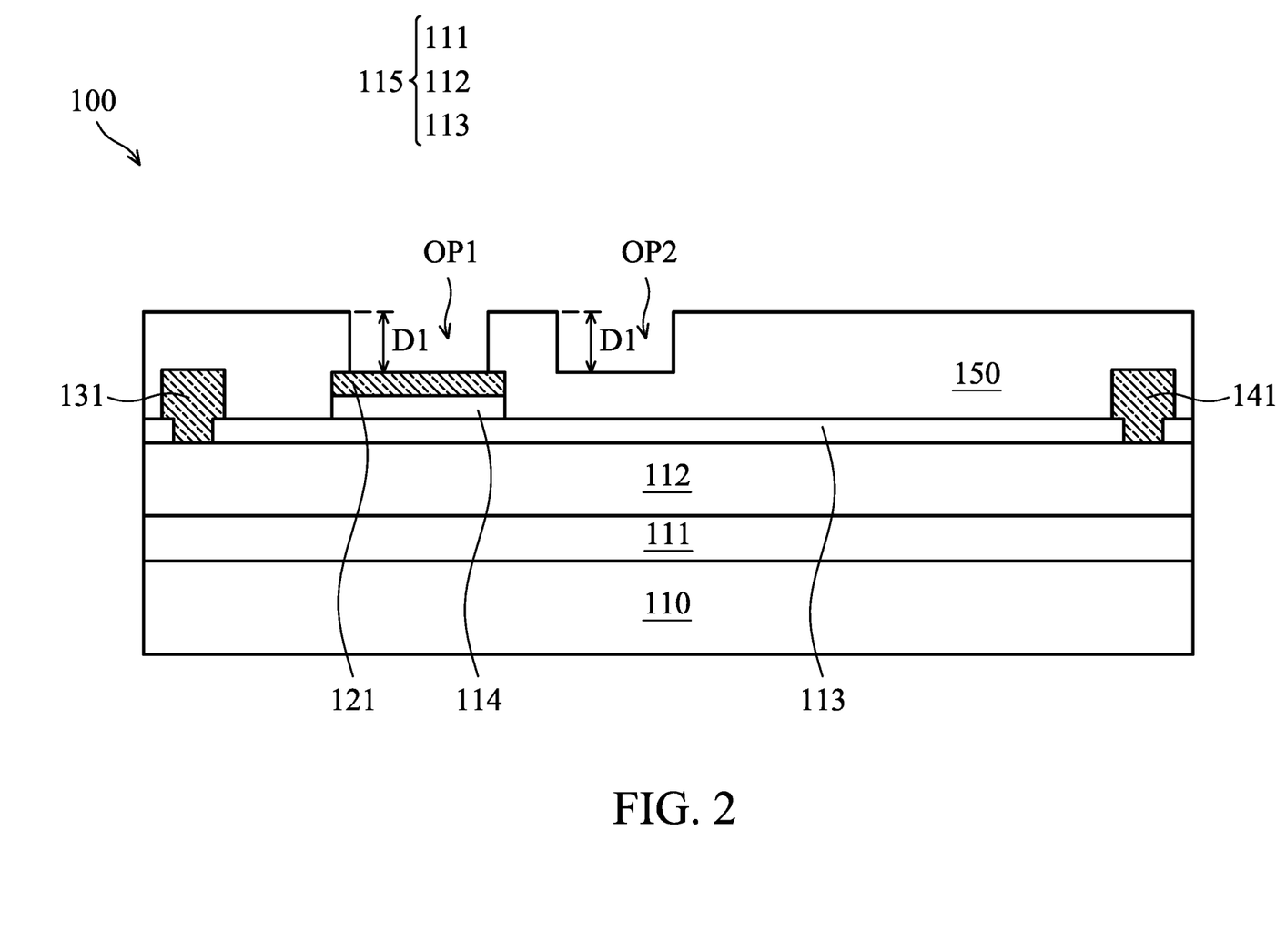

Referring to FIG. 2, a first dielectric layer 150 is formed on the compound semiconductor layer 115, and the first dielectric layer 150 covers the gate electrode 121, the source electrode 131, and the drain electrode 141. Then, a patterning process is performed on the first dielectric layer 150 to form a first opening OP1 and a second opening OP2 adjacent to the first opening OP1, wherein the second opening OP2 is between the gate electrode 121 and the drain electrode 141.

In some embodiments, the first dielectric layer 150 may include single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials on the compound semiconductor layer 115 (e.g. the barrier layer 113), the gate electrode 121, the source electrode 131, and the drain electrode 141 to form the first dielectric layer 150.

Subsequently, a patterning process is performed on the first dielectric layer 150, wherein the patterning process may include a photolithography process and an etching process. The photolithography process may include photoresist coating (e.g., spin-coating), soft baking, exposure, post-exposure baking, photoresist developing, rinsing and drying (e.g., hard baking), other suitable processes, or a combination thereof. The etching process may include such as a wet etching process, a dry etching process, other suitable etching processes, or a combination thereof. In some embodiments, the etch chemistry used in the wet etching process may include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), or any combination thereof. In some embodiments, the etch chemistry used in the dry etching process may include a fluorocarbon based chemistry (e.g., fluorinated hydrocarbons), such as tetrafluoromethane ($CF_4$), trifluromethance ($CHF_3$), or the like. In some embodiments, a patterned photoresist (not shown) is formed on the first dielectric layer 150 by a photolithography process, and a first etching (or so-called main etching) step is performed on the first dielectric layer 150 through an opening (not shown) of the patterned photoresist.

As shown in FIG. 2, the first opening OP1 and the second opening OP2 adjacent to the first opening OP1 are formed simultaneously by performing the first etching step on the first dielectric layer 150, wherein the first opening OP1 exposes the gate electrode 121. The first opening OP1 and the second opening OP2 which are formed by the first etching step have the same depth D1.

Subsequently, referring to FIG. 3, a second etching (or so-called over etching) step is performed to ensure the depth of the first opening OP1 reaches the desirable depth D1 and deepen the second opening OP2 at the same time. According to some embodiments of the present disclosure, the gate electrode 121 exposed from the first opening OP1 serves as an etch stop layer in the second etching step so that the depth of the first opening OP1 maintains the depth D1. The second etching step deepens the depth of the second opening OP2 to be the depth D2, and the difference between the depth D2 and depth D1 is depth D3 (i.e. D1+D3=D2). In some embodiments, the width of the formed first opening OP1 is smaller than the width of the gate electrode 121, and the width W1 of the formed second opening OP2 is in a range from about 5 nanometers (nm) to about 5 micrometers (um). It should be noted that the width W1 of the second opening OP2 may be adjusted depending on the distance between the gate electrode 121 and the drain electrode 141 and the application of the semiconductor device, so the width W1 is not limited to the above range. For example, when the distance between the gate electrode 121 and the drain electrode 141 becomes larger, the length of the drift region is increased. In such cases, the width W1 may be increased so that the gate metal layer subsequently formed in the second opening OP2 serving as a gate field plate can more effectively reduce the risk of the gate structure suffering from a high electric field.

Figure 3:
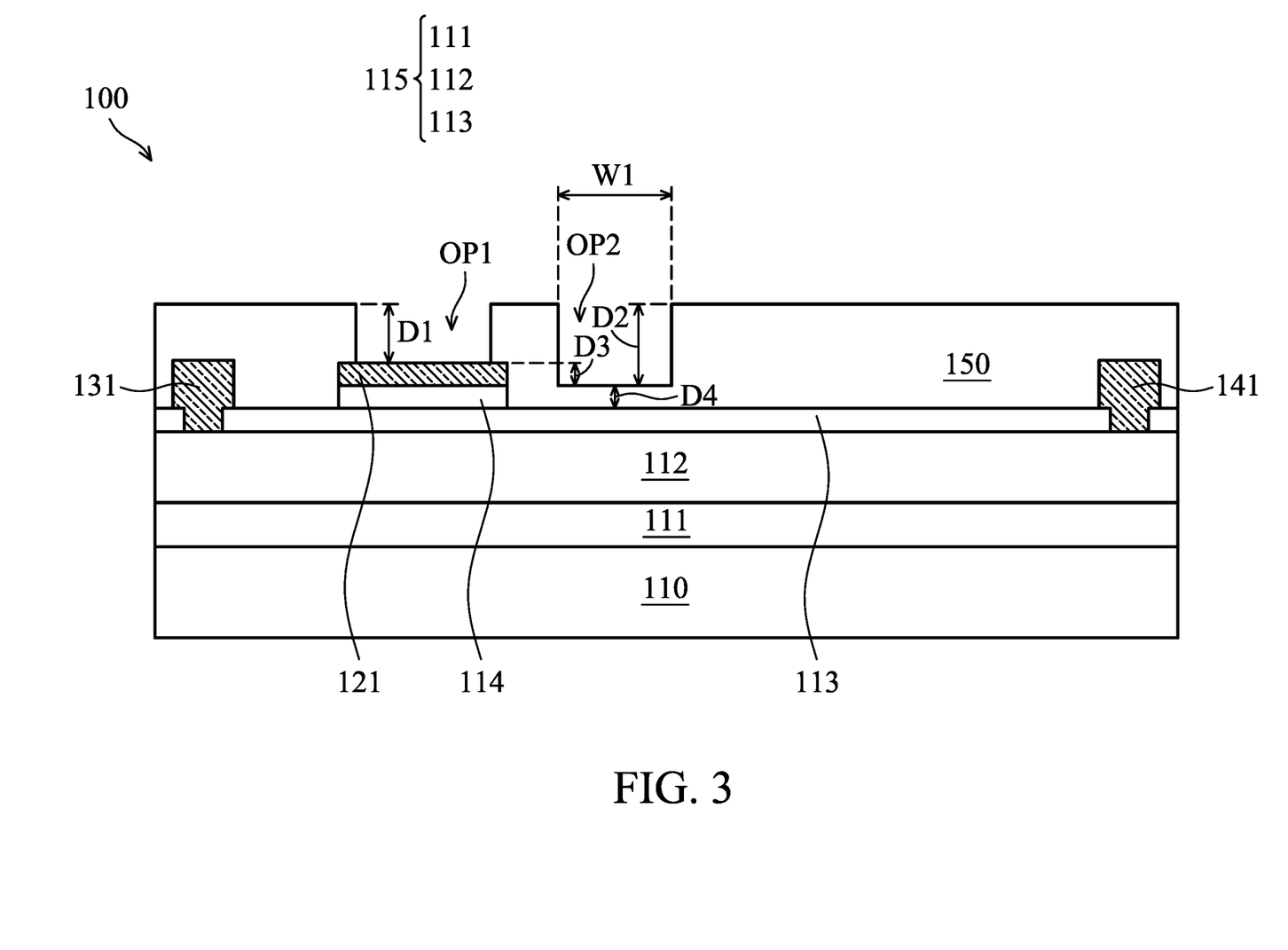

Still referring to FIG. 3, specifically, the depth D2 may be adjusted by adjusting the processing conditions (e.g. etching time, etching speed, concentration of etch chemistry) of the second etching step, and the depth D2 of the second opening OP2 is controlled without exposing the compound semiconductor layer 115 under the first dielectric layer. By adjusting the processing conditions of the second etching step, the distance D4 between the bottom of the second opening OP2 and the top surface of the compound semiconductor layer 115 (e.g. the barrier layer 113) may be in a range from about 5 nm to about 5 um to prevent leakage current in the barrier layer 113 of the compound semiconductor layer 115, which could cause an electrical abnormality. In some embodiments, the ratio of the depth D3 deepened by the second etching step in the second opening OP2 to the depth D1 of the first opening OP1 (i.e. D3/D1) is within a range from about 0.05 to about 0.5, such as from about 0.1 to about 0.3. In other embodiments, the ratio of the depth D3 to the depth D1 is about 0.2. In other words, in some embodiments, the ratio of the depth D2 of the second opening OP2 to the depth D1 of the first opening OP1 (i.e. D2/D1) is within a range from about 1.05 to about 1.5, such as from about 1.1 to about 1.3. In other embodiments, the ratio of the depth D2 to the depth D1 is about 1.2.

Subsequently, referring to FIG. 4, a gate metal layer 122 is conformally formed to cover the top surface of the first dielectric layer 150, the first opening OP1, and the second opening OP2 and serve as a gate field plate. The gate electrode 121 and the gate metal layer 122 constitute the gate structure 120. The first portion 122a of the formed gate metal layer 122 at the bottom of the first opening OP1 is higher than the second portion 122b of the gate metal layer 122 at the bottom of the second opening OP2. Specifically, the vertical distance between the bottom of the first portion 122a of the gate metal layer 122 and the second portion 122b of the gate metal layer 122 is substantially the same as the depth D3. In some embodiments, the thickness of the gate metal layer 122 is in a range from about 0.1 um to about 1 um. It should be noted that although the embodiment of the present disclosure merely illustrates that the thickness of the gate metal layer 122 is smaller than the depth D1 and the depth D2, the thickness of the gate metal layer 122 may be adjusted, depending on the design of the finished product to be larger than the depth D1 and/or the depth D2 (not shown) in other embodiments. In the embodiment that the thickness of the gate metal layer 122 is larger than the depth D1 and/or the depth D2, the gate metal layer 122 may fill up the first opening OP1 and/or the second opening OP2 (not shown).

In some embodiments, the gate metal layer 122 may be formed by a deposition process and a patterning process. The material of the gate metal layer 122 may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantulum carbide (TaC), tantulum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

Referring to FIG. 4A in conjunction with FIG. 4B, the structure illustrated in FIG. 4B is substantially the same as the structure illustrated in FIG. 4A, and the difference is that the gate metal layer 122 in the cross-sectional diagram shown in FIG. 4A is a continuous metal layer, and the gate metal layer 122' in the cross-sectional diagram shown in FIG. 4B is a discrete metal layer. Specifically, in FIG. 4A, the gate metal layer 122 completely covers the first dielectric layer 150 between the first opening OP1 and the second opening OP2. In FIG. 4B, the gate metal layer 122' only partially covers the first dielectric layer 150 between the first opening OP1 and the second opening OP2. According to some embodiments of the present disclosure, the coverage of the continuous gate metal layer 122 or the discrete gate metal layer 122' which serves as a gate field plate to the first dielectric layer 150 between the first opening OP1 and the second opening OP2 is merely exemplary and may be adjusted depending on the circuit layout of the semiconductor device, so the embodiments of the present disclosure is not limited thereto.

Subsequently, referring to FIG. 5, a second dielectric layer 151 is formed to cover the first dielectric layer 150 and the gate metal layer 122. A source contact 132 and a drain contact 142 are formed to penetrate the first dielectric layer 150 and the second dielectric layer 151 to be in contact with the source electrodes 131 and the drain electrode 141 respectively, and a source field plate 133 and the drain metal layer 143 are formed on the second dielectric layer 151. The formed source contact 132, the source field plate 133, and the aforementioned source electrode 131 constitute the source structure 130, and the formed drain contact 142, the drain metal layer 143, and the aforementioned drain electrode 141 constitute the drain structure 140. In the embodiments, the second dielectric layer 151 is formed between the gate metal layer 122 and the source field plate 133. As shown in FIG. 5, the source field plate 133 extends in the direction from the gate electrode 121 to the drain electrode 141, and the source field plate 133 can mitigate the electric field gradient at the side of the gate electrode 121 proximate the drain electrode 141. By the arrangement of the gate metal layer 122 serving as a gate field plate and the source field plate 133, the risk of the gate structure 120 suffering from a high electric field can be more effectively reduced in the semiconductor structure 100 provided in some embodiments of the present disclosure.

In some embodiments, the materials of the second dielectric layer 151 may be selected from the materials for forming the first dielectric layer 150. The materials and formation methods of the source contact 132, the source field plate 133, the drain contact 142, and the drain metal layer 143 are substantially the same as those of the gate metal layer 122. The details are not described again herein to avoid repetition. It should be noted that although the embodiment of the present disclosure merely illustrates single second dielectric layer 151 and single source field plate 133, but the embodiments of the present disclosure is not limited thereto. The number of second dielectric layers 151 and of source field plates 133 may be adjusted, depending on the design of the finished product. On the other hand, the length of the source field plate 133 illustrated in FIG. 5 is merely exemplary and it may also be adjusted, depending on the design of the finished product.

FIG. 6 illustrates a cross-sectional diagram of the exemplary semiconductor structure 100. Compared with FIG. 5, the semiconductor structure 100 illustrated in FIG. 6 further includes a third dielectric layer 152 formed on the source field plate 133 and the drain metal layer 143, a source field plate 134, and a drain metal layer 144. In some embodiments, the materials of the third dielectric layer 152 may be selected from the materials for forming the first dielectric layer 150 and the second dielectric layer 151. The materials and formation methods of the source field plate 134 and the drain metal layer 144 are substantially the same as those of the gate metal layer 122, the source contact 132, the source field plate 133, the drain contact 142, and the drain metal layer 143. The details are not described again herein to avoid repetition. It should be noted that although the embodiment of the present disclosure merely illustrates single third dielectric layer 152, single source field plate 134, and single drain metal layer 144, but the embodiments of the present disclosure is not limited thereto. The number of third dielectric layers 152, source field plates 134, and drain metal layers 144 may be adjusted depending on the circuit layout of the semiconductor structure 100.

According to some embodiments of the present disclosure, the semiconductor structure 100 illustrated in FIG. 6 reduces the risk of the gate structure 120 suffering from a high electric field by the portion of the gate metal layer 121 which is near the surface of the compound semiconductor layer 115 (e.g. the barrier layer 113) and lower than the top surface of the gate electrode as a gate field plate. The distance D4 between the portion of the gate metal layer 122 and the surface of the barrier layer 133 is mainly adjusted by the second etching step in the method for forming the semiconductor structure 100. Therefore, the leakage current in the semiconductor structure 100 can be reduced and the breakdown voltage can be enhanced by the gate metal layer 122 thus formed without adding additional production cost to allow the semiconductor structure 100 to be applied to high voltage operation.

Figure 7:
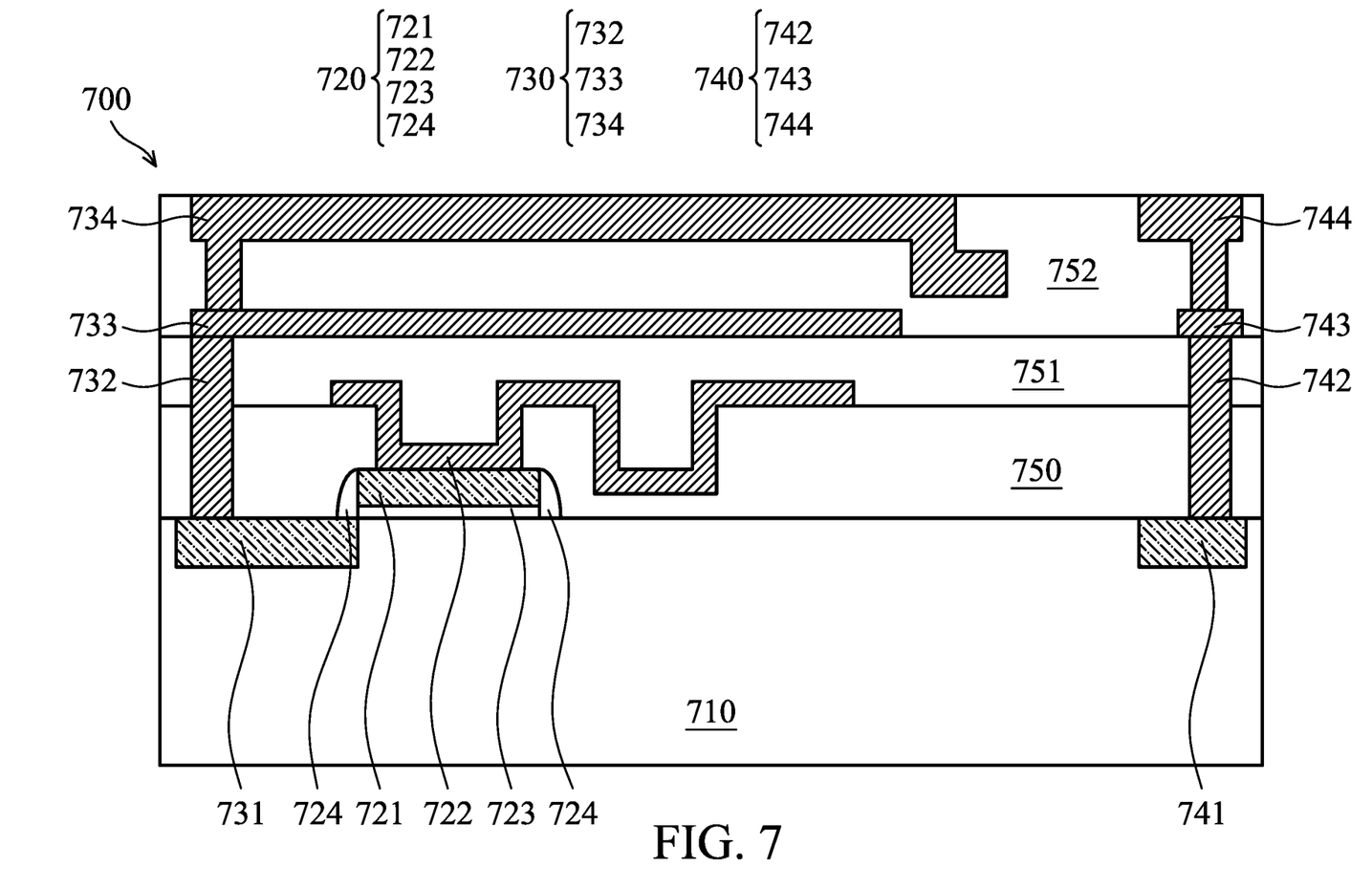
FIG. 7 is a cross-sectional diagram illustrating an exemplary semiconductor structure according to other embodiments of the present disclosure.

FIG. 7 is a cross-sectional diagram illustrating an exemplary semiconductor structure 700 according to other embodiments of the present disclosure. The arrangement of the gate field plate and the source field plate provided in the present disclosure is not limited to the semiconductor structure 100 illustrated in the FIGS. 1-6. For example, the aforementioned arrangement may also be applied to the semiconductor structure 700 which serves as a metal-oxide-semiconductor field-effect transistor (MOSFET), illustrated in FIG. 7.

As shown in FIG. 7, a substrate 710 of the semiconductor structure 700 includes a source region 731 in contact with the source structure 730 and a drain region 741 in contact with the drain structure 740, and the gate structure 720 of the semiconductor structure 700 further includes a gate dielectric layer 723 disposed between the gate electrode 721 and the substrate 710. According to some embodiments of the present disclosure, the gate electrode 721, a gate metal layer 722, the gate dielectric layer 723, and gate spacers 724 constitute the gate structure 720. The source electrode 732, a source field plate 733, and the source metal layer 732 constitute the source structure 730. The drain electrode 742 and the drain metal layers 743, 744 constitute the drain structure 740.

The formation of the semiconductor structure 700 includes providing the substrate 710, forming the gate structure 720 on the substrate 710, and forming the source region 731 and the drain region 741 in the substrate 710 at opposite sides of the gate structure 720. In some embodiments, the substrate 710 may be a semiconductor substrate, such as a silicon substrate, but the embodiments of the present disclosure is not limited thereto. For example, the substrate 710 may be an elemental semiconductor including germanium. In other embodiments, the substrate 710 may also be a semiconductor on insulator substrate, and the semiconductor on insulator substrate may include a substrate, a buried oxide layer disposed on the substrate, and a semiconductor layer disposed on the buried oxide layer. In addition, the conductivity type of the substrate 710 may be n-type or p-type.

In some embodiments, the formation of the gate structure 720 includes forming the gate dielectric layer 723 on the substrate 710, forming the gate electrode 721 on the gate dielectric layer 723, and forming the gate spacers 724 at the opposite sides of the gate dielectric layer 723 and the gate electrode 721. In some embodiments, the materials of the gate dielectric layer 723 may include silicon oxide, silicon nitride, silicon oxynitride, high-k dielectric materials, a combination thereof, or other suitable dielectric materials. In some embodiments, the gate dielectric layer 723 may be formed by thermal oxidation, chemical vapor deposition (CVD), or atomic layer deposition (ALD). The materials of the gate electrode 721 may include metal silicides, amorphous silicon, polysilicon, one of more kinds of metals, metal nitrides, conductive metal oxides, a combination thereof, or other suitable conductive materials. The conductive material may be formed by chemical vapor deposition (CVD), sputtering, resistive thermal evaporation process, electron beam evaporation process, or other suitable deposition processes.

The formation of the semiconductor structure 700 further includes performing an ion implantation process to dope suitable dopants to the substrate 710 to form the source region 731 and the drain region 741. In some embodiments, the source region 731 and the drain region 741 are n-type doped regions, and the n-type dopant of which may be such as N, P, As, Sb, Bi, other suitable dopants, or a combination thereof. In other embodiments, the source region 731 and the drain region 741 are p-type doped regions, and the p-type dopant of which may be such as B, Al, Ga, In, Tl, other suitable dopants, or a combination thereof. The formed source region 731 is in contact with the subsequently formed source structure 730 (e.g. the source contact 732), and the formed drain region 741 is in contact with the subsequently formed drain structure 740 (e.g. the drain contact 742). According to some embodiments of the present disclosure, after the formation of the gate electrode 721, the source region 731, and the drain region 741, the formation steps shown in FIGS. 2-5 can be continued to form the semiconductor structure 700 as shown in FIG. 7. The details are not described again herein to avoid repetition.

In summary, the semiconductor structure provided in present disclosure reduces the risk of the gate structure suffering from a high electric field by using the gate metal layer which is near the surface of the substrate and lower than the top surface of the gate electrode as a gate field plate. In addition to the semiconductor structures of high electron mobility transistor (HEMT) and metal-oxide-semiconductor field-effect transistor (MOSFET), the above configuration can also be applied to other types of high voltage integrated circuit components. The embodiments of the present disclosure adjust the distance between the gate metal layer and the substrate by the second etching step (i.e. the over etching step) in the process for forming the semiconductor structure to make the gate metal layer near the surface of the substrate without contact. Therefore, the leakage current in the semiconductor structure can be reduced and the breakdown voltage can be enhanced by the gate metal layer thus formed to allow the semiconductor structure to be applied to high voltage operation without adding additional production cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate electrode disposed on the substrate;
   a first dielectric layer disposed on the substrate, wherein the first dielectric layer has a first opening exposing the gate electrode and a second opening adjacent to the first opening, and a depth of the second opening is greater than a depth of the first opening;
   a gate metal layer conformally covering a top surface of the first dielectric layer, the first opening, and the second opening to serve as a gate field plate, wherein a first portion of the gate metal layer at a bottom of the first opening is higher than a second portion of the gate metal layer at a bottom of the second opening, wherein the gate electrode and the gate metal layer form a gate structure; and
   a source structure and a drain structure disposed on the substrate and at opposite sides of the gate structure, wherein the second opening is disposed between the gate electrode and the drain structure.

2. The semiconductor structure as claimed in claim 1, wherein the source structure comprises a source contact and a source field plate, wherein the source field plate extends in a direction from the gate electrode to the drain structure.

3. The semiconductor structure as claimed in claim 2, further comprising a second dielectric layer disposed between the gate metal layer and the source field plate.

4. The semiconductor structure as claimed in claim 1, wherein a ratio of the depth of the second opening to the depth of the first opening is in a range from 1.05 to 1.5.

5. The semiconductor structure as claimed in claim 1, wherein a distance between the second portion and the substrate is in a range from 5 nm to 5 um.

6. The semiconductor structure as claimed in claim 1, wherein a width of the second portion is in a range from 5 nm to 5 um.

7. The semiconductor structure as claimed in claim 1, wherein the gate metal layer only partially covers the first dielectric layer between the first opening and the second opening.

8. The semiconductor structure as claimed in claim 1, further comprising a compound semiconductor layer disposed on the substrate, wherein the compound semiconductor layer comprises:
  a buffer layer disposed on the substrate;
  a channel layer disposed on the buffer layer, wherein the source structure and the drain structure respectively contact the channel layer through a source electrode and a drain electrode; and
  a barrier layer disposed on the channel layer.

9. The semiconductor structure as claimed in claim 8, further comprising a doped compound semiconductor layer disposed between the gate electrode and the barrier layer.

10. The semiconductor structure as claimed in claim 1, wherein the substrate is a silicon substrate which comprises a source region in contact with the source structure and a drain region in contact with the drain structure, and the gate structure further comprises a gate dielectric layer disposed between the gate electrode and the silicon substrate.

11. A method for forming a semiconductor structure, comprising:
  providing a substrate;
  forming a gate electrode on the substrate;
  forming a first dielectric layer on the substrate and covering the gate electrode;
  performing a first etching step to form a first opening and a second opening which is adjacent to the first opening in the first dielectric layer, wherein the first opening exposes the gate electrode;
  performing a second etching step to deepen the second opening, wherein the gate electrode exposed from the first opening serves as an etch stop layer;
  conformally forming a gate metal layer to cover a top surface of the first dielectric layer, the first opening, and the second opening to serve as a gate field plate, wherein a first portion of the gate metal layer at a bottom of the first opening is higher than a second portion of the gate metal layer at a bottom of the second opening, wherein the gate electrode and the gate metal layer form a gate structure; and
  forming a source structure and a drain structure on the substrate and at opposite sides of the gate structure, wherein the second opening is disposed between the gate electrode and the drain structure.

12. The method as claimed in claim 11, wherein the forming of the source structure comprises forming a source contact and a source field plate, wherein the source field plate extends in a direction from the gate electrode to the drain structure.

13. The method as claimed in claim 12, further comprising forming a second dielectric layer between the gate metal layer and the source field plate.

14. The method as claimed in claim 11, wherein the second etching step is adjusted so that a ratio of the depth of the second opening to the depth of the first opening is in a range from 1.05 to 1.5.

15. The method as claimed in claim 11, wherein the second etching step is adjusted so that a distance between the second portion and the substrate is in a range from 5 nm to 5 um.

16. The method as claimed in claim 11, wherein a width of the second portion is in a range from 5 nm to 5 um.

17. The method as claimed in claim 11, wherein the gate metal layer only partially covers the first dielectric layer between the first opening and the second opening.

18. The method as claimed in claim 11, further comprising forming a compound semiconductor layer on the substrate before the forming of the gate electrode, wherein the forming of the compound semiconductor layer comprises:
  forming a buffer layer on the substrate;
  forming a channel layer on the buffer layer, wherein the source structure and the drain structure respectively contact the channel layer through a source electrode and a drain electrode; and
  forming a barrier layer on the channel layer.

19. The method as claimed in claim 18, further comprising forming a doped compound semiconductor layer on the barrier layer before the forming of the gate electrode.

20. The method as claimed in claim 11, wherein the substrate is a silicon substrate which comprises a source region in contact with the source structure and a drain region in contact with the drain structure, and the gate structure further comprises a gate dielectric layer disposed between the gate electrode and the silicon substrate.

* * * * *